United States Patent
Leu et al.

(10) Patent No.: US 7,183,003 B2
(45) Date of Patent: Feb. 27, 2007

(54) THERMAL INTERFACE MATERIAL AND METHOD FOR MANUFACTURING SAME

(75) Inventors: Charles Leu, Fremont, CA (US); Tai-Cherng Yu, Tu-Chen (TW); Ga-Lane Chen, Fremont, CA (US)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 45 days.

(21) Appl. No.: 10/900,816

(22) Filed: Jul. 27, 2004

(65) Prior Publication Data
US 2005/0136248 A1     Jun. 23, 2005

(30) Foreign Application Priority Data
Dec. 23, 2003   (TW)   ............... 92136527 A

(51) Int. Cl.
*B32B 9/00*     (2006.01)
(52) U.S. Cl. ...................... 428/408; 977/742
(58) Field of Classification Search ............ 428/408, 428/673; 427/249, 250; 165/185
See application file for complete search history.

(56) References Cited

U.S. PATENT DOCUMENTS

| | | | |
|---|---|---|---|
| 5,026,748 A * | 6/1991 | Adams et al. ............ 524/66 |
| 5,052,481 A * | 10/1991 | Horvath et al. .......... 165/185 |
| 5,094,769 A * | 3/1992 | Anderson et al. ........ 252/71 |
| 5,989,459 A * | 11/1999 | Nguyen et al. .......... 252/503 |
| 6,350,488 B1 | 2/2002 | Lee et al. |
| 6,407,922 B1 | 6/2002 | Eckblad et al. |
| 2005/0161210 A1* | 7/2005 | Zhong et al. ............ 165/185 |
| 2005/0269726 A1* | 12/2005 | Matabayas ............... 264/104 |

OTHER PUBLICATIONS

J. Phys. Chem.. B., 105 (22), 5075-5078, 2001.*
Savas Berber, Young-Kyun Kwon, and David Tomanek; Unusually High Thermal Conductivity of Carbon Nanotubes; p. 4613, vol. 84, Physical Review Letters 2000.
Shoushan Fan, Michael G. Chapline, Nathan R. Franklin, Thomas W. Tombler, Alan M. Cassell, and Hongjie Dai; Self-Oriented Regular Arrays of Carbon Nanotubes and Their Field Emission Properties: pp. 512-514, vol. 283, Science 1999.
Liang Liu and Shoushan Fan; Isotope Labeling of Carbon Nanotubes and Formation 12C-13C Nanotubes Junctions; pp. 11502-11503, vol. 123. J. Am. Chem. Soc. 2001.

* cited by examiner

*Primary Examiner*—Jennifer C. McNeil
*Assistant Examiner*—Daniel Miller
(74) *Attorney, Agent, or Firm*—Wei Te Chung

(57) ABSTRACT

A thermal interface material (40) includes a silver colloid base (32), and an array of carbon nanotubes (22) disposed in the silver colloid base uniformly. The silver colloid base includes silver particles, boron nitride particles and polysynthetic oils. The silver colloid base has a first surface (42), and a second surface (44) opposite to the first surface. The carbon nanotubes are substantially parallel to each other, and extend from the first surface to the second surface. A method for manufacturing the thermal interface material includes the steps of: (a) forming an array of carbon nanotubes on a substrate; (b) immersing the carbon nanotubes in a silver colloid base; (c) solidifying the silver colloid base; and (d) peeling the solidified silver colloid base with the carbon nanotubes secured therein off from the substrate.

8 Claims, 1 Drawing Sheet

THERMAL INTERFACE MATERIAL AND METHOD FOR MANUFACTURING SAME

BACKGROUND OF THE INVENTION

1. Field of the invention

The invention relates generally to thermal interface materials and manufacturing methods thereof; and more particularly to a kind of thermal interface material which conducts heat by using carbon nanotubes, and a manufacturing method thereof.

2. Description of Related Art

Electronic components such as semiconductor chips are becoming progressively smaller, while at the same time heat dissipation requirements thereof are increasing. Commonly, a thermal interface material is utilized between the electronic component and a heat sink in order to dissipate heat generated by the electronic component.

A conventional thermal interface material is obtained by diffusing particles with a high heat conduction coefficient in a base material. The particles can be graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

A new kind of thermal interface material has recently been developed. The thermal interface material is obtained by fixing carbon fibers with polymer. The carbon fibers are distributed directionally, and each carbon fiber can provide a heat conduction path. A heat conduction coefficient of this kind of thermal interface material is relatively high. However, the heat conduction coefficient of the thermal interface material is inversely proportional to a thickness thereof, and the thickness is required to be greater than 40 micrometers. In other words, the heat conduction coefficient is limited to a certain value corresponding to a thickness of 40 micrometers. The value of the heat conduction coefficient cannot be increased, because the thickness cannot be reduced.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/mK (watts/milliKelvin) at room temperature.

U.S. Pat. No. 6,407,922 discloses another kind of thermal interface material. The thermal interface material is formed by injection molding, and has a plurality of carbon nanotubes incorporated in a matrix material. A first surface of the thermal interface material engages with an electronic device, and a second surface of the thermal interface material engages with a heat sink. The second surface has a larger area than the first surface, so that heat can be uniformly spread over the larger second surface.

However, the thermal interface material formed by injection molding is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, heat does not necessarily spread directly from a first surface of the thermal interface material engaged with an electronic device to a second surface of the thermal interface material engaged with a heat sink.

A new thermal interface material which overcomes the above-mentioned problems and a method for manufacturing such material are desired.

BRIEF SUMMARY OF THE INVENTION

Accordingly, an object of the present invention is to provide a thermal interface material having a reduced thickness, good flexibility and excellent heat conduction.

Another object of the present invention is to provide a method for manufacturing the above-described thermal interface material.

To achieve the first of the above-mentioned objects, the present invention provides a thermal interface material comprising a silver colloid base and an array of carbon nanotubes disposed in the silver colloid base uniformly. The silver colloid base comprises silver particles, boron nitride particles and polysynthetic oils. The silver colloid base has a first surface, and a second surface opposite to the first surface. The carbon nanotubes are substantially parallel to each other, and extend from the first surface to the second surface.

To achieve the second of the above-mentioned objects, a method for manufacturing the thermal interface material comprises the steps of:

(a) forming an array of carbon nanotubes on a substrate;
(b) immersing the carbon nanotubes in a silver colloid base;
(c) solidifying the silver colloid base; and
(d) peeling the solidified silver colloid base with the carbon nanotubes secured therein off from the substrate to obtain the thermal interface material.

Unlike in a conventional thermal interface material, the carbon nanotubes of the thermal interface material of the present invention are disposed in the silver colloid base uniformly and directionally. Thus, each carbon nanotube of the thermal interface material can provide a heat conduction path in a direction perpendicular to a main heat absorbing surface of the thermal interface material. This ensures that the thermal interface material has a high heat conduction coefficient.

Other objects, advantages and novel features of the invention will become more apparent from the following detailed description when taken in conjunction with the accompanying drawings, in which:

DESCRIPTION OF THE PREFERRED EMBODIMENT

Figure 1:
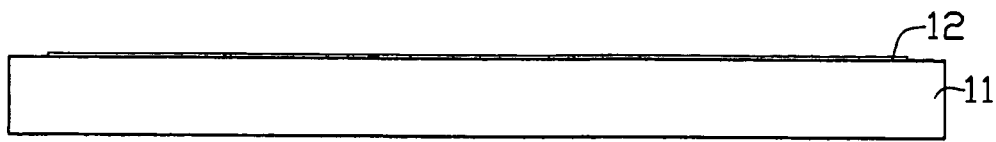
FIG. 1 is a schematic side elevation of a substrate having a catalyst film attached thereon according to the present invention.
Figure 2:
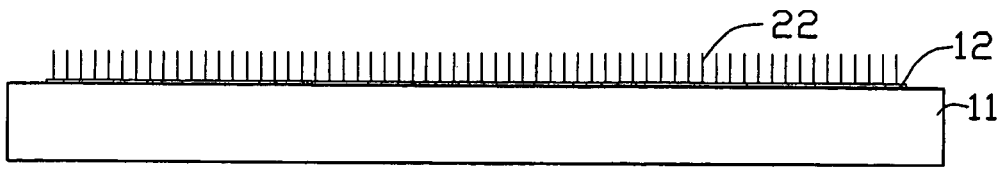
FIG. 2 is similar to FIG. 1, but showing an array of carbon nanotubes directionally formed on the substrate.

Referring to FIG. 1, a substrate 11 having a catalyst film 12 attached thereon is shown. In FIG. 2, an array of carbon nanotubes 22 directionally formed on the substrate 11 is shown. The catalyst film 12 is uniformly disposed on the substrate 11 by chemical vapor deposition, thermal disposition, electron-beam disposition, or sputtering. The substrate 11 can be made of glass, quartz, silicon, or alumina. In the preferred embodiment, the substrate 11 is made of porous silicon. A surface of the porous silicon is a porous layer. Diameters of apertures in the porous layer are extremely small, generally about 3 nanometers. The catalyst film 12 can be made of iron (Fe), cobalt (Co), nickel (Ni), or an alloy thereof. In the preferred embodiment, the catalyst film 12 is made of iron (Fe).

The catalyst film 12 is oxidized to obtain catalyst particles (not shown). Then, the substrate 11 with the catalyst particles disposed thereon is placed in a reaction furnace (not shown), and a carbon source gas is provided in the reaction furnace at a temperature of 700–1000° C. to grow the array of carbon nanotubes 22. The carbon source gas can be acetylene or ethene. A height of the array of carbon nanotubes 22 can be controlled by controlling the growth time thereof. The height of the array of carbon nanotubes 22 is generally in the range from 1 to 100 micrometers. In the preferred embodiment, the height of the array of carbon nanotubes 22 is about 100 micrometers. Details of the method for growing the array of carbon nanotubes 22 can be found in pages 512–514, Vol. 283, Science 1999, and in pages 11502–11503, Vol. 123, J. Am. Chem. Soc. 2001. Moreover, U.S. Pat. No. 6,350,488 discloses a method for mass synthesis of arrays of carbon nanotubes. These three publications are incorporated herein by reference.

Figure 3:
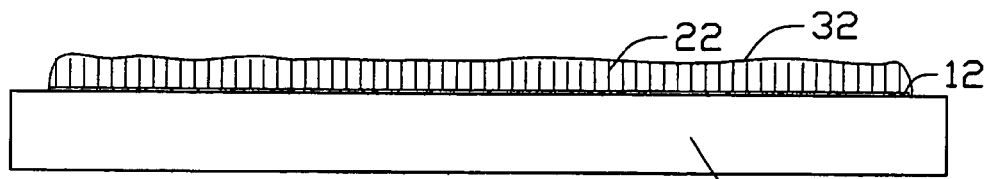
FIG. 3 is similar to FIG. 2, but showing the carbon nanotubes immersed in a silver colloid base.

FIG. 3 shows the carbon nanotubes 22 immersed in a silver colloid base 32. That is, after the growth of the carbon nanotubes 22 is completed, a silver colloid base 32 is provided in order to completely immerse the carbon nanotubes 22 therewithin. The silver colloid base 32 comprises silver particles, boron nitride particles and polysynthetic oils, and has a high heat conduction coefficient and a low volatility. Diameters of the silver particles are in the range from 1 to 90 nanometers, a purity of the silver particles is about 99.9%, and diameters of the boron nitride particles are in the range from 1–30 nanometers. The boron nitride particles can ensure stable heat conduction. A viscosity of the silver colloid base 32 is required to be below 100 cps (centipoise).

Figure 4:
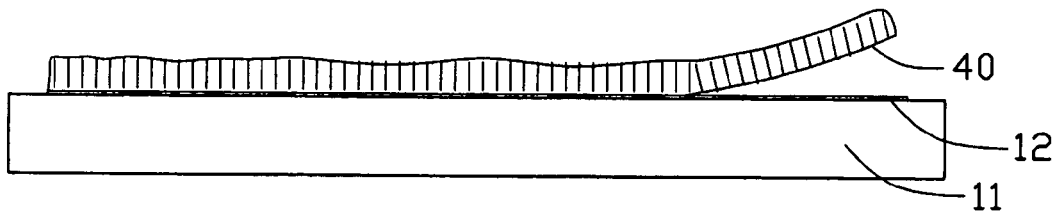
FIG. 4 is similar to FIG. 3, but showing the solidified silver colloid base with the carbon nanotubes secured therein being peeled off from the substrate.

Referring to FIG. 4, the silver colloid base 32 is cooled and solidified, and the solidified silver colloid base 32 with the carbon nanotubes 22 secured therein is peeled off from the substrate 11 to obtain the thermal interface material 40. A thickness of the thermal interface material 40 is preferably about 100 micrometers, being equal to the height of the carbon nanotubes 22. That is, the thickness of the thermal interface material 40 is determined by the height of the carbon nanotubes 22. Thus, the thickness of the thermal interface material 40 can be varied by controlling the height of the carbon nanotubes 22.

Figure 5:
FIG. 5 is similar to FIG. 4, but only showing the thermal interface material of the present invention, the thermal interface material comprising the solidified silver colloid base and the carbon nanotubes disposed therein.

FIG. 5 shows the thermal interface material 40 of the present invention in isolation. The thermal interface material 40 comprises the silver colloid base 32, and the array of carbon nanotubes 22 disposed in the silver colloid base 32 uniformly. The silver colloid base 32 has a first surface 42, and a second surface 44 opposite to the first surface 42. The carbon nanotubes 22 are substantially parallel to each other, and extend from the first surface 42 to the second surface 44. In the preferred embodiment, the carbon nanotubes 22 are perpendicular to the first surface 42 and the second surface 44. Thus, each carbon nanotube 22 can provide a heat conduction path in a direction perpendicular to a selected main heat absorbing surface of the thermal interface material 40. Therefore, the thermal interface material 40 has a high heat conduction coefficient and can conduct heat uniformly.

Figure 6:
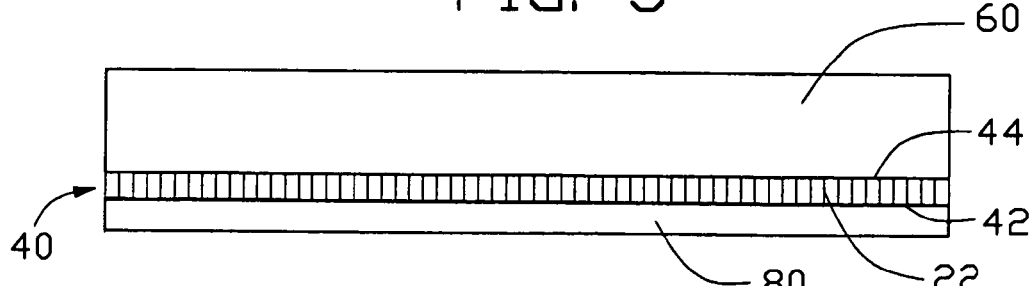
FIG. 6 is similar to FIG. 5, but showing the thermal interface material sandwiched between an electronic device and a heat sink.

FIG. 6 shows an application of the thermal interface material 40 of the present invention. The thermal interface material 40 is disposed between a heat sink 60 and an electronic device 80 to provide good heat contact between the heat sink 60 and the electronic device 80. The first surface 42 of the silver colloid base 32 engages with a surface (not labeled) of the electronic device 80, and the second surface 44 of the silver colloid base 32 engages with a surface (not labeled) of the heat sink 60. Because the thickness of the thermal interface material 40 is on a micron scale, the thermal interface material 40 has good flexibility. Thus, even if the surface of the electronic device 80 is uneven, the thermal interface material can provide good heat contact between the heat sink 60 and the electrical device 80.

It is understood that the above-described embodiment is intended to illustrate rather than limit the invention. Variations may be made to the embodiment without departing from the spirit of the invention. Accordingly, it is appropriate that the appended claims be construed broadly and in a manner consistent with the scope of the invention.

What is claimed is:

1. A thermal interface material comprising:
    a silver colloid base having a first surface and a second surface opposite to the first surface; and
    a plurality of carbon nanotubes uniformly disposed in the silver colloid base, the carbon nanotubes being substantially parallel to each other, the carbon nanotubes extending from the first surface to the second surface of the silver colloid base.

2. The thermal interface material as claimed in claim 1, wherein the carbon nanotubes are substantially perpendicular to the first and second surfaces of the silver colloid base.

3. The thermal interface material as claimed in claim 1, wherein a thickness of the thermal interface material is in the range from 1 to 100 micrometers.

4. The thermal interface material as claimed in claim 1, wherein the first and second surfaces of the silver colloid base are substantially parallel to each other.

5. The thermal interface material as claimed in claim 1, wherein the silver colloid base comprises silver particles, boron nitride particles and polysynthetic oils.

6. The thermal interface material as claimed in claim 5, wherein diameters of the silver particles are in the range from 1 to 90 nanometers, a purity of the silver particles is about 99.9%, and diameters of the boron nitride particles are in the range from 1 to 30 nanometers.

7. The thermal interface material as claimed in claim 1, wherein a viscosity of the silver colloid base is below 100 cps (centipoises).

8. An electrical apparatus comprising:
    an electronic device;
    a heat sink; and
    a thermal interface material interposed between the electronic device and the heat sink, the thermal interface material comprising:
        a silver colloid base having a first surface and a second surface opposite to the first surface; and
        a plurality of carbon nanotubes uniformly disposed in the silver colloid base, the carbon nanotubes being substantially parallel to each other, the carbon nanotubes each extending from the first surface to the second surface of the silver colloid base.

* * * * *